United States Patent
Ota et al.

(10) Patent No.: US 7,262,897 B2
(45) Date of Patent: *Aug. 28, 2007

(54) METHOD OF FORMING INORGANIC ALIGNMENT FILM, INORGANIC ALIGNMENT FILM, SUBSTRATE FOR ELECTRONIC DEVICE, LIQUID CRYSTAL PANEL AND ELECTRONIC APPARATUS

(75) Inventors: Hidenobu Ota, Suwa (JP); Yukihiro Endo, Suwa (JP); Osamu Iwamoto, Chino (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/931,813

(22) Filed: Sep. 1, 2004

(65) Prior Publication Data

US 2005/0084626 A1  Apr. 21, 2005

(30) Foreign Application Priority Data

Sep. 2, 2003  (JP)  ............... 2003-310203

(51) Int. Cl.
*G02B 26/00* (2006.01)
*G02F 1/1337* (2006.01)
*B05D 3/00* (2006.01)
*C09K 19/00* (2006.01)

(52) U.S. Cl. ............... 359/237; 359/291; 427/567; 428/1.21

(58) Field of Classification Search ............... 359/290, 359/291, 237, 583, 629; 349/123, 124; 428/1.21, 428/1.2, 1.1; 427/524, 529, 567; 353/20, 353/31, 33

See application file for complete search history.

(56) References Cited

U.S. PATENT DOCUMENTS

| | | | |
|---|---|---|---|
| 5,657,102 A * | 8/1997 | Mizushima et al. | 349/124 |
| 5,770,826 A * | 6/1998 | Chaudhari et al. | 204/157.15 |
| 6,287,649 B1 * | 9/2001 | Fukushima et al. | 428/1.2 |
| 6,379,010 B1 * | 4/2002 | Suzuki et al. | 353/31 |
| 6,632,483 B1 * | 10/2003 | Cesare Callegari et al. | 427/526 |
| 2002/0063830 A1 | 5/2002 | Callegari et al. | 349/124 |
| 2003/0136997 A1 * | 7/2003 | Shioga et al. | 257/306 |
| 2005/0078248 A1 * | 4/2005 | Ota et al. | 349/123 |
| 2005/0079297 A1 * | 4/2005 | Ota et al. | 428/1.32 |
| 2005/0084624 A1 * | 4/2005 | Ota et al. | 428/1.6 |
| 2005/0084625 A1 * | 4/2005 | Ota et al. | 428/1.21 |

FOREIGN PATENT DOCUMENTS

| | | |
|---|---|---|
| JP | 05-88177 | 9/1993 |
| JP | 6-281937 | 10/1994 |
| JP | 10-161133 | 6/1998 |
| JP | 2002-287146 | 3/2002 |

OTHER PUBLICATIONS

Examination result issued in Chinese application No. 10-2004-0070434.
Examination result issued in Chinese application No. 10-2004-0069723.
Communication from Korean Patent Office regarding counterpart application.

* cited by examiner

*Primary Examiner*—Scott J. Sugarman
*Assistant Examiner*—M. Hasan
(74) *Attorney, Agent, or Firm*—Harness, Dickey & Pierce, P.L.C.

(57) ABSTRACT

A method of forming an inorganic alignment film on a base substrate is provided comprising forming a film made substantially of an inorganic material on the base substrate, and irradiating ion beams onto the surface of the film from a direction inclined at a predetermined angle $\theta_b$ with respect to the direction vertical to the surface. By irradiating the ion beams onto the film, concave portions having a predetermined directivity are formed on the film. The predetermined angle $\theta_b$ is preferably 2° or more.

17 Claims, 11 Drawing Sheets

METHOD OF FORMING INORGANIC ALIGNMENT FILM, INORGANIC ALIGNMENT FILM, SUBSTRATE FOR ELECTRONIC DEVICE, LIQUID CRYSTAL PANEL AND ELECTRONIC APPARATUS

RELATED APPLICATIONS

This application claims priority to Japanese Patent Application No. 2003-310203 filed Sep. 2, 2003 which is hereby expressly incorporated by reference herein in its entirety.

BACKGROUND

1. Technical Field

The present invention relates to a method of forming an inorganic alignment film, an inorganic alignment film, a substrate for an electronic device, a liquid crystal panel, and an electronic apparatus.

2. Background Art

A projection display device in which an image is projected on a screen is known. In the projection display device, a liquid crystal panel is mainly used to form an image.

Normally, such a liquid crystal panel has an alignment film which is set to have a predetermined pretilt angle, thereby aligning liquid crystal molecules in a desired direction. In manufacturing the alignment film, a method of rubbing a thin film made of a polymer compound such as polyimide which is formed on a substrate in a direction by using a cloth such as rayon is known (for example, see Japanese Unexamined Patent Application Publication No. 10-161133 (claims)).

However, the alignment film made of a polymer compound such as polyimide commonly causes optical deterioration according to the environment and duration of use. When optical deterioration occurs, materials constituting the alignment film, the liquid crystal layer and so on decompose and adversely affect the performance of liquid crystal or the like.

Further, static electricity or dust particles are generated by the rubbing process, which may result in lowering the reliability of the display devices.

It is an object of the present invention to provide an inorganic alignment film having excellent light resistance and capable of controlling a pretilt angle more effectively, a substrate for an electronic device having the inorganic alignment film, a liquid crystal panel and an electronic apparatus. Further, it is another object of the present invention to provide a method of forming the inorganic alignment film.

SUMMARY

These objects can be achieved by the present invention described below.

A method of forming an inorganic alignment film on a base substrate according to the present invention comprises a film-forming step of forming a film made substantially of an inorganic material on the base substrate, and a milling step of irradiating ion beams onto a surface of the film from a direction inclined at a predetermined angle $\theta_b$ with respect to a direction vertical to the surface.

Therefore, it is possible to obtain an inorganic alignment film having excellent light resistance and capable of reliably controlling a pretilt angle.

In the method of forming an inorganic alignment film of the present invention, in the milling step, concave portions having a predetermined directivity are preferably formed in the film by irradiating the ion beams onto the film.

Therefore, it is possible to obtain an inorganic alignment film having an excellent ability for regulating the alignment properties of the liquid crystal molecules.

In the method of forming an inorganic alignment film of the present invention, in the milling step, the predetermined angle $\theta_b$ is preferably 2° or more.

Therefore, it is possible to form concave portions having a predetermined directivity more efficiently and to form a suitable pretilt angle more efficiently.

In the method of forming an inorganic alignment film of the present invention, in the milling step, an acceleration voltage of the ion beams during the irradiation of the ion beams is preferably 400 to 1400 V.

Therefore, it is possible to form each concave portion with a suitable inclined surface more efficiently.

In the method of forming an inorganic alignment film of the present invention, in the milling step, the current of the ion beams to be irradiated is preferably 100 to 1000 mA.

Therefore, it is possible to improve a regulation ability of the inorganic alignment film to the alignment properties of the liquid crystal molecules.

In the method of forming an inorganic alignment film of the present invention, in the milling step, the pressure of an atmosphere in the vicinity of the film is preferably $5.0 \times 10^{-3}$ Pa or less.

Therefore, it is possible to improve the rectilinearity of the ion beams, and thus it is possible to form the concave portions having a predetermined directivity more efficiently.

In the method of forming an inorganic alignment film of the present invention, in the film-forming step, the film is preferably formed by a sputtering method.

Therefore, it is possible to form the film more efficiently.

In the method of forming an inorganic alignment film of the present invention, the inorganic material may be substantially composed of silicon oxide.

Thus, it is possible to allow resulting liquid crystal panels to have more excellent light resistance.

An inorganic alignment film of the present invention is formed by a method of forming an inorganic alignment film of the present invention.

Therefore, it is possible to provide the inorganic alignment film having excellent light resistance and capable of effectively controlling the pretilt angle.

In the inorganic alignment film of the present invention, the average thickness of the inorganic alignment film is preferably 0.02 to 0.3 μm.

Therefore, it is possible to form a more suitable pretilt angle and also control the alignment state of the liquid crystal molecules more accurately.

A substrate for an electronic device of the present invention comprises electrodes and an inorganic alignment film of the present invention on a substrate.

Therefore, it is possible to provide the substrate for an electronic device with excellent light resistance.

A liquid crystal panel of the present invention comprises an inorganic alignment film of the present invention and a liquid crystal layer.

Therefore, it is possible to provide a liquid crystal panel having excellent light resistance.

A liquid crystal panel of the present invention comprises a pair of inorganic alignment films, each being formed by a method of forming an inorganic alignment film according to the present invention, and a liquid crystal layer interposed between the pair of inorganic alignment films.

Therefore, it is possible to provide a liquid crystal panel having excellent light resistance.

An electronic apparatus of the present invention comprises a liquid crystal panel of the present invention.

Therefore, it is possible to provide an electronic apparatus with high reliability.

An electronic apparatus of the present invention comprises light valves each having a liquid crystal panel of the present invention, and an image is projected using at least one of the light valves.

Therefore, it is possible to provide an electronic apparatus with high reliability.

An electronic apparatus of the present invention comprises three light valves, corresponding to red, green and blue, which form an image, a light source, a color separating optical system for separating light from the light source into red, green and blue light components and guiding each light component to the corresponding light valve, a color synthesizing optical system for synthesizing the image, and a projecting optical system for projecting the synthesized image, each light valve comprising a liquid crystal panel of the present invention.

Therefore, it is possible to provide an electronic apparatus with high reliability.

According to the present invention, it is possible to provide an inorganic alignment film having excellent light resistance and capable of controlling a pretilt angle more effectively, a substrate for an electronic device comprising the inorganic alignment film, a liquid crystal panel and an electronic apparatus. Further, it is possible to provide a method of forming the inorganic alignment film.

DETAILED DESCRIPTION

A method of forming an inorganic alignment film, an inorganic alignment film, a substrate for an electronic device, a liquid crystal panel and an electronic apparatus will now be described in detail with reference to the attached drawings.

First, prior to describing the method of forming the inorganic alignment film, the liquid crystal panel of the present invention will be described.

Figure 1:
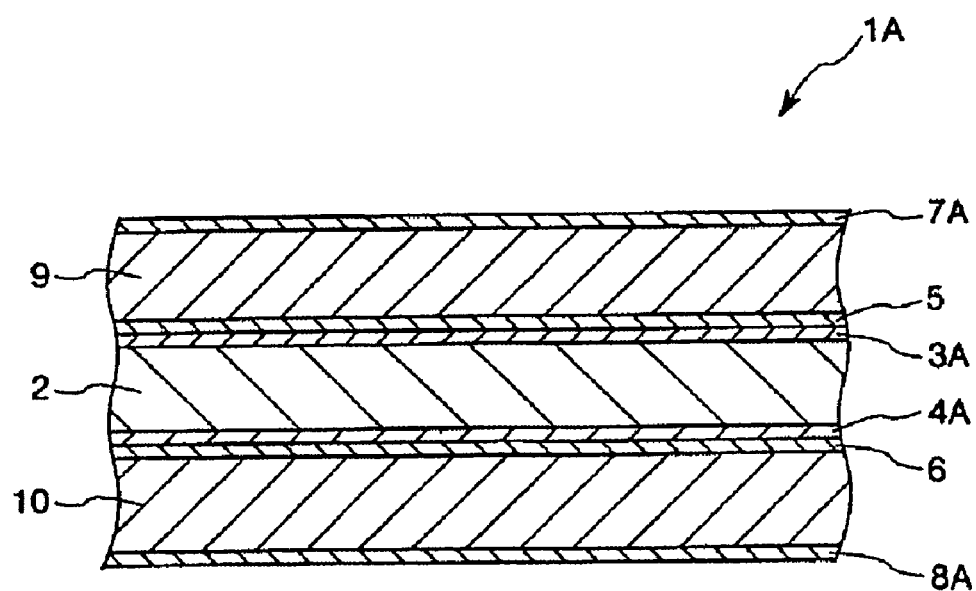
FIG. 1 is a schematic longitudinal cross-sectional view showing a first embodiment of a liquid crystal panel according to the present invention.
Figure 2:
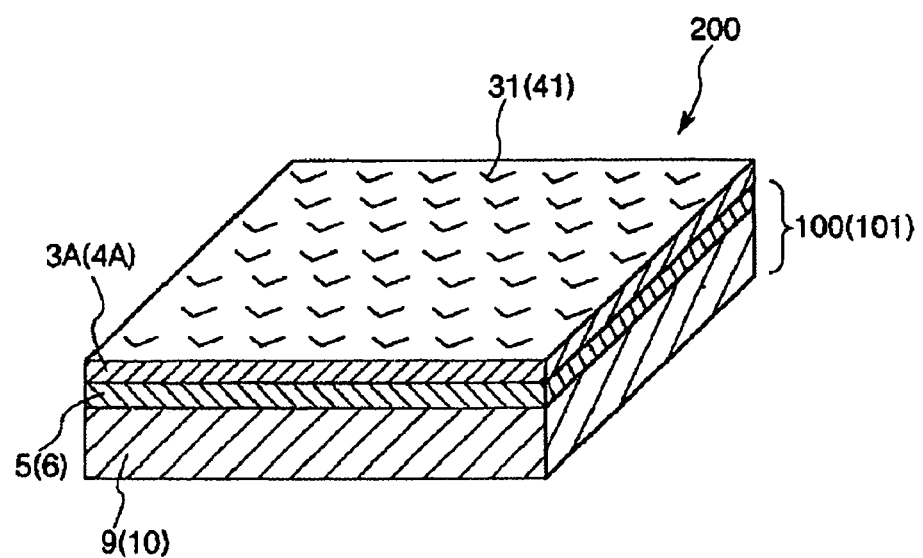
FIG. 2 is a partial perspective view showing schematically a surface state of an inorganic alignment film formed by a method according to the present invention.
Figure 3:
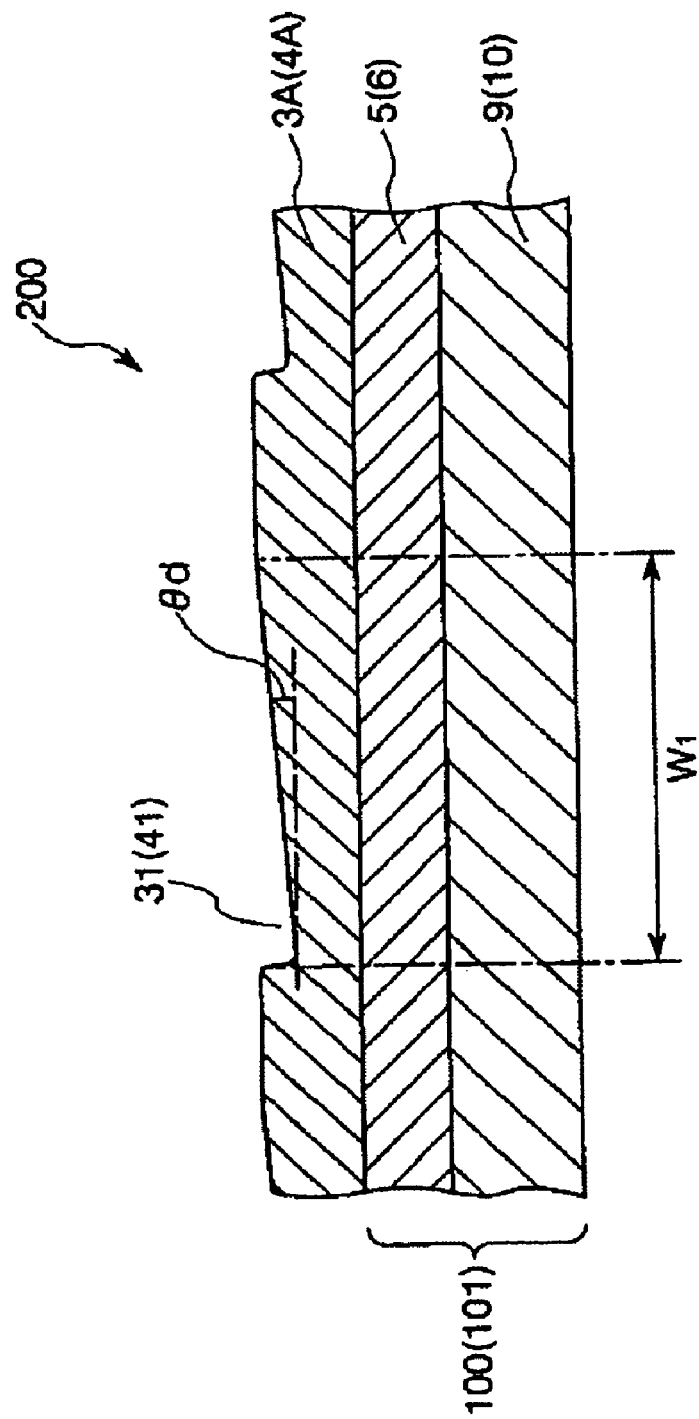
FIG. 3 is a partial longitudinal cross-sectional view showing an inorganic alignment film formed by a method according to the present invention.

FIG. 1 is a schematic longitudinal cross-sectional view showing a first embodiment of the liquid crystal panel according to the present invention. FIG. 2 is a partial perspective view showing schematically a surface state of an inorganic alignment film formed by a method according to the present invention. FIG. 3 is a partial longitudinal cross-sectional view showing an inorganic alignment film formed by a method according to the present invention. Hereinafter, an upper side and a lower side in FIG. 3 are referred as 'an upper portion' and 'a lower portion', respectively.

As shown in FIG. 1, a liquid crystal panel 1A has a liquid crystal layer 2, inorganic alignment films 3A and 4A, transparent conductive films 5 and 6, polarizing films 7A and 8A, and substrates 9 and 10.

In such a construction, a substrates for electronic device of the present invention is formed by the substrate 9, the transparent conductive film 5 (electrode) and the inorganic alignment film 3A, or by the substrate 10, the transparent conductive film 6 (electrode) and the inorganic alignment film 10A respectively.

The liquid crystal layer 2 is substantially made of liquid crystal molecules.

The liquid crystal molecules constituting the liquid crystal layer 2 include liquid crystal molecules obtained by aligning nematic liquid crystal, smectic liquid crystal or the like, but, in a TN liquid crystal panel, it is preferable to form nematic liquid crystal. For example, phenylcyclohexane derivative liquid crystal, biphenyl derivative liquid crystal, biphenylcyclohexane derivative liquid crystal, terphenyl derivative liquid crystal, phenylether derivative liquid crystal, phenylester derivative liquid crystal, bicyclohexane derivative liquid crystal, azomethine derivative liquid crystal, azoxy derivative liquid crystal, pyrimidine derivative liquid crystal, dioxane derivative liquid crystal, and cubane derivative liquid crystal are included. The liquid crystal molecules obtained by introducing fluoric substituent such as a monofluoro group, a difluoro group, a trifluoro group, a trifluoromethyl group, a trifluoromethoxy group, and a difluoromethoxy group into the nematic liquid crystal are included.

The inorganic alignment films 3A and 4A are arranged on both surfaces of the liquid crystal layer 2.

Further, the inorganic alignment film 3A is formed on a base substrate 100 comprising the transparent conductive film 5 and the substrate 9 as described below, and the inorganic alignment film 4A is formed on a base substrate 101 comprising the transparent conductive film 6 and the substrate 10 as described below.

The inorganic alignment films 3A and 4A have a function regulating an alignment state of the liquid crystal molecules constructing the liquid crystal layer 2 when a voltage is not applied.

Such inorganic alignment films 3A and 4A are formed, for example, by a method described below, that is, a method of forming an inorganic alignment film according to the present invention.

As shown in FIG. 2, the inorganic alignment film 3A has a plurality of concave portions 31 having a predetermined directivity. Similarly, the inorganic alignment film 4A has a plurality of concave portions 41 having a predetermined directivity.

Therefore, it is possible to form the inorganic alignment film having an excellent ability for regulating the alignment properties of the liquid crystal molecules.

Since the concave portions 31 and 41 have almost the same shape, hereinafter, the concave portions 31 will be representatively described.

The concave portions 31 may be provided at any positions on the surface of the inorganic alignment film 3A and preferably are provided at random positions as shown in FIG. 2. As described above, if the concave portions 31 are provided at the random positions, it is possible to form the concave portions 31 relatively easily when the concave portions 31 are formed, for example, by a method described below. Further, if the concave portions 31 are provided at the random positions, the alignments of the liquid crystal molecules in a vertical direction of the paper in FIG. 3 are suppressed, as compared with a case wherein the concave portions 31 are regularly formed, for example, each concave portion 31 has a recess shape and is formed in a widthwise direction of the base substrate 100, whereby the respective concave portions 31 are arranged at an equal interval (for example, like a washboard).

By the way, since adjacent liquid crystal molecules naturally tend toward the same directivity, even when the liquid crystal molecules enter into the concave portions 31 as described above, the liquid crystal molecules partially enter into the concave portions 31. As a result, the liquid crystal molecules have a tendency to increase the alignment property of all the liquid crystals. Therefore, like the present embodiment, if the concave portions 31 are formed at random positions on the inorganic alignment film, it is possible to form the concave portions relatively easily, and it is possible to make the alignment properties of the liquid crystal molecules good.

As shown in FIG. 3, the respective concave portions 31 have a surface (an inclined surface) at an angle $\theta_d$ with respect to a direction parallel to the surface of the transparent conductive film 5 described below. Thus, it is possible to form the suitable pretilt angle more effectively.

Further, the inclination direction of the inclined surfaces of the concave portions 31 is substantially arranged in order on the inorganic alignment film 3A, as shown in FIG. 2. Thus, each concave portion has a predetermined directivity. As a result, it is possible to regulate the alignment properties of the liquid crystal molecules more surely.

The inclination angle $\theta_d$ of the inclined surface is not specifically limited, but it is preferably 2 to 30°, and more preferably, 2 to 10°. Thus, it is possible to form the suitable pretilt angle more surely.

Further, as seen from the upper portion of FIG. 3 in a plan view, the average width (an average of maximum width) $W_1$ of the concave portions 31 and 41 in the inclination direction of the inclined surface are preferably 5 to 500 nm, and more preferably, 8 to 20 nm. Thus, it is possible to further improve the alignment properties of the liquid crystal molecules.

Further, as seen from the upper portion of FIG. 3 in a plan view, the average width (an average of maximum width) $W_2$ of the concave portions 31 in a direction orthogonal to the inclination of the inclined surface is preferably 5 to 500 nm, and more preferably, 8 to 20 nm. Thus, it is possible to further improve the alignment properties of the liquid crystal molecules. To the contrary, if the width $W_2$ is too small, it may be difficult to control the alignment state (the pretilt angle) of the liquid crystal molecules when a voltage is not applied. Meanwhile, if the width $W_2$ is too large, it may be difficult to align the liquid crystal molecules in a predetermined direction.

The inorganic alignment films 3A and 4A are substantially made of an inorganic material. Since the inorganic material generally has excellent chemical stability as compared with an organic material, the inorganic alignment films 3A and 4A have excellent light resistance as compared with an alignment film made of the organic material.

As the inorganic material described above, for example, silicon oxide such as $SiO_2$ and SiO, or metallic oxide such as MgO and ITO can be used. Among them, in particular, it is preferable to use silicon oxide. Thus, it is possible to allow resultant liquid crystal panels to have more excellent light resistance.

The average thickness (an average thickness except for portions in which the concave portions are formed) of such an inorganic alignment film 3A or 4A is preferably 0.02 to 0.3 μm, and more preferably, 0.02 to 0.08 μm. If the average thickness is less than such a lower limit value, it may be difficult to make the pretilt angle in each portion sufficiently uniform. Meanwhile, if the average thickness exceeds such an upper limit value, a driving voltage may rise, and thus a consumption power may increase.

Moreover, in the present embodiment, the inorganic alignment film having the concave portions at random positions on the surface thereof is described, but the inorganic alignment film may have the concave portions at regular positions on the surface thereof.

On the side of an outer surface of the inorganic alignment film 3A (the side of a surface opposite to a surface facing the liquid crystal layer 2), the transparent conductive film 5 is arranged. Similarly, on the side of an outer surface of the inorganic alignment film 4A (the side of a surface opposite to a surface facing the liquid crystal layer 2), the transparent conductive film 6 is arranged.

The transparent conductive films 5 and 6 have a function of driving (changing the alignment of) the liquid crystal molecules of the liquid crystal layer 2 when an electrical conduction is performed (current flows) between the transparent conductive films 5 and 6.

A control of the electrical conduction between the transparent conductive films 5 and 6 is performed by controlling a current to be supplied from a control circuit (not shown) which is connected to the transparent conductive films.

The transparent conductive films 5 and 6 have a conductive property, and are made of, for example, indium tin oxide (ITO), indium oxide (IO), tin oxide ($SnO_2$) or the like.

On the side of an outer surface of the transparent conductive film 5 (the side of a surface opposite to a surface facing the inorganic alignment film 3A), the substrate 9 is arranged. Similarly, On the side of an outer surface of the transparent conductive film 6 (the side of a surface opposite to a surface facing the inorganic alignment film 4A), the substrate 10 is arranged.

The substrates 9 and 10 have a function for supporting the above-mentioned liquid crystal layer 2, the inorganic alignment films 3A and 4A, the transparent conductive films 5 and 6, and the polarizing films 7A and 8A described below. The material of the substrates 9 and 10 is not specifically limited, but it may include a glass material such as quartz glass or a plastic material such as polyethyleneterephthalate. Among them, it is preferable to use a glass material such as quartz glass. Thus, it is possible to obtain the liquid crystal panel having excellent stability in which a curve or bending is almost never generated. It should be noted that, in FIG. 1, a sealing material, wiring lines and so on are omitted.

On an outer surface of the substrate 9 (a surface opposite to a surface facing the transparent conductive film 5), the polarizing film (a polarizing plate, a polarizing film) 7A is arranged. Similarly, on an outer surface of the substrate 10 (a surface opposite to a surface facing the transparent conductive film 6), the polarizing film (a polarizing plate, a polarizing film) 8A is arranged.

The material of the polarizing films 7A and 8A may include, for example, polyvinylalcohol (PVA). Further, as the polarizing film, a material with iodine doped into the above-mentioned material may be used.

As the polarizing film, a film, for example, made of the above-mentioned material and extended in one axis direction may be used.

By arranging such polarizing films 7A and 8A, it is possible to more effectively control light transmittance by adjusting the amount of the electrical conduction.

The directions of the polarizing axes of the polarizing films 7A and 8A are, normally determined by the alignment directions of the inorganic alignment films 3A and 4A.

Next, an example of a method of forming an inorganic alignment film according to the present will be described.

The method of forming an inorganic alignment film according to the present comprises a film-forming step and a milling step as described below.

FIG. 4 is a view for explaining the method of forming an inorganic alignment film according to the present invention.

Hereinafter, only a case of forming the inorganic alignment film 3A on the base substrate 100 will be described, but the inorganic alignment film 4A can also be formed similarly.

Film-Forming Step

Figure 4A:
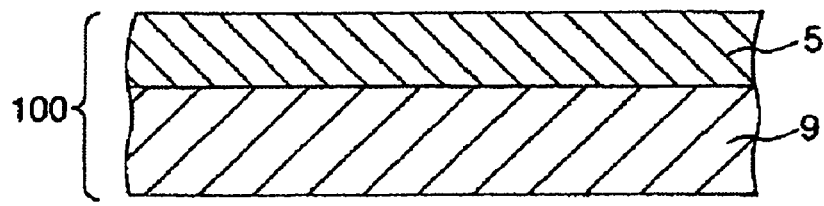
FIGS. 4(*a*)–(*c*) are views for explaining a method of forming an inorganic alignment film according to the present invention.
Figure 4B:
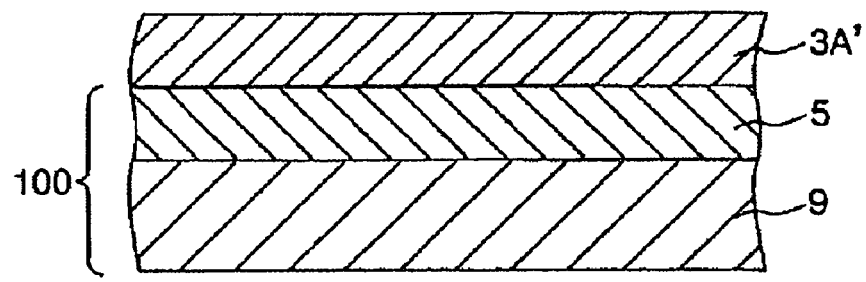

In the present step, on the base substrate 100, a film 3A' made substantially of the above mentioned inorganic material is formed (see FIGS. 4(a) and 4(b)).

A method for forming the film 3A' on the base substrate 100 is not specifically limited, but any one of a sputtering method (for example, a magnetron sputtering method, an ion beam sputtering method, or the like), a vapor deposition method, a sol-gel method, a self-organizing method and so on may be used. Among them, it is particularly preferable to use the sputtering method. Thus, it is possible to form the film 3A' more efficiently.

Hereinafter, a case in which the ion beam sputtering method is representatively used will be described.

Figure 5:
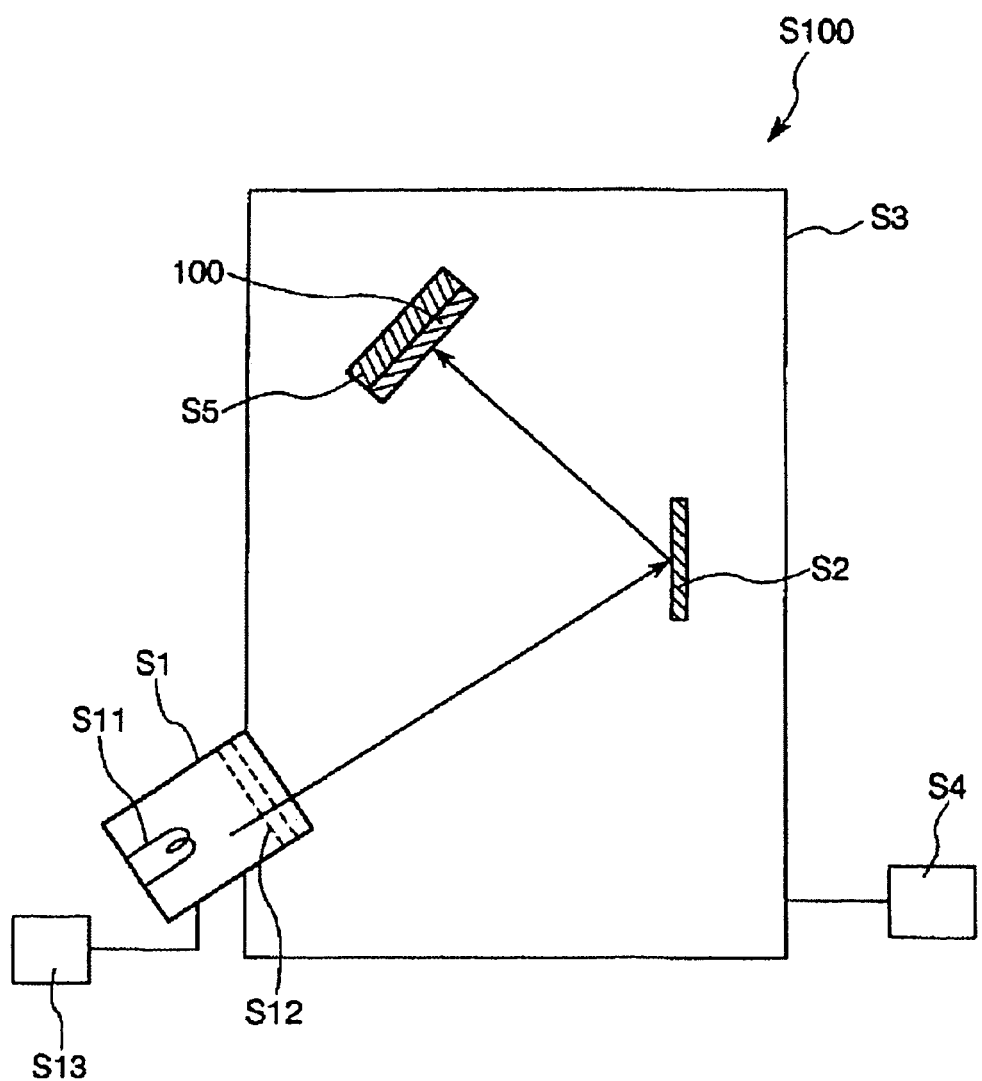
FIG. 5 is a schematic view of an ion beam sputter device for forming a film.

FIG. 5 is a schematic of an ion beam sputter device for forming the film.

The ion beam sputter device S100 shown in FIG. 5 has an ion source S1 for irradiating ion beams, a target S2 for generating (irradiating) sputter particles by the irradiation of the ion beams, a vacuum chamber S3, an air pump S4 for controlling a pressure within the vacuum chamber S3, and a base substrate holder S5 for fixing the base substrate with the inorganic alignment film formed thereon in the vacuum chamber S3.

The ion source S1 has a filament S11 therein, and a leading out electrode S12. Further, to the ion source S1, a gas supply source S13 for supplying gas into the ion source S1 is connected.

A case in which the film 3A' is formed using the ion beam sputter device shown in FIG. 5 will now be schematically described.

1. The base substrate 100 is provided in the base substrate holder S5 in the vacuum chamber S3.

2. A pressure within the vacuum chamber S3 is reduced by the air pump S4.

3. Gas is supplied from the gas supply source S13 into the ion source S1.

4. A voltage is applied to the filament S11 from a power source (not shown), such that hot electrons are generated.

5. The generated hot electrons collide against introduced gas, and the gas is ionized, such that plasmas (ions) are generated.

6. An acceleration voltage of ions is applied to the leading-out electrode S12, and the ions are accelerated and irradiated onto the target S2 as the ion beams.

7. The target S2 onto which the ion beams are irradiated illuminates sputter particles toward the base substrate 100, such that a substrate in which the film 3A' is formed on the base substrate 100 is obtained.

A pressure within the vacuum chamber S3, that is, the pressure of an atmosphere when the film 3A' is formed is preferably $5 \times 10^{-1}$ Pa or less, and more preferably, $5 \times 10^{-2}$ Pa or less. Thus, it is possible to more efficiently form the film 3A'. If the pressure within the vacuum chamber S3 is too high, it is likely to cause the rectilinearity of the irradiated sputter particles to be lowered. As a result, a sufficiently uniform film may not be formed.

An ion acceleration voltage to be applied to the leading-out electrode S12 is not specifically limited, but it is preferably 400 to 1400 V, and more preferably 800 to 1400 V. Thus, it is possible to more efficiently form the film 3A'. To the contrary, if the acceleration voltage of ions is less than the above-mentioned lower limit value, a sputter rate may be lowered, and sufficient productivity may not be obtained. Meanwhile, if the acceleration voltage exceeds the above-mentioned upper limit value, a sufficiently uniform film may not be formed.

A temperature of the base substrate 100 at the time of the formation of the film 3A' is preferably relatively low. More specifically, the temperature of the base substrate 100 is preferably set to 150° C. or less, more preferably 100° C. or less, and still further preferably 80 to 50° C. Thus, it is possible to suppress a phenomenon in which the sputter particles attached to the base substrate 100 move from originally attached positions, that is, migrations, and thus it is possible to further improve a regulation ability of the resultant inorganic alignment film 3A to the alignment properties of the liquid crystal molecules. Moreover, if necessary, the base substrate 100 may be cooled such that the temperature of the base substrate 100 at the time of the formation of the film 3A' falls within the above-mentioned range.

Gas to be supplied from the gas supply source S13 into the ion source S3 is not specifically limited, is preferably a noble gas, further, among them, it is particularly preferable to use argon gas. Thus, it is possible to improve a forming speed of the film 3A'.

The material constituting the target S2 is suitably selected according to the material for forming the film 3A'. For example, in the case in which an inorganic alignment film made of $SiO_2$ is formed, a target S2 made of $SiO_2$ may be used, and in the case in which the inorganic alignment film made of SiO is used, a target S2 made of SiO may be used.

Milling Step

Figure 4C:
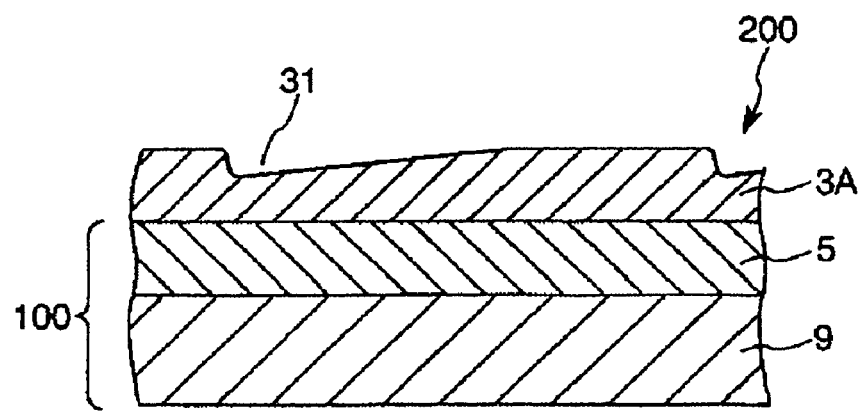

In the present step, as shown in FIG. 4(c), a plurality of concave portions 31 having a predetermined directivity are formed on the film 3A' obtained in the above-mentioned film-forming step.

Figure 6:
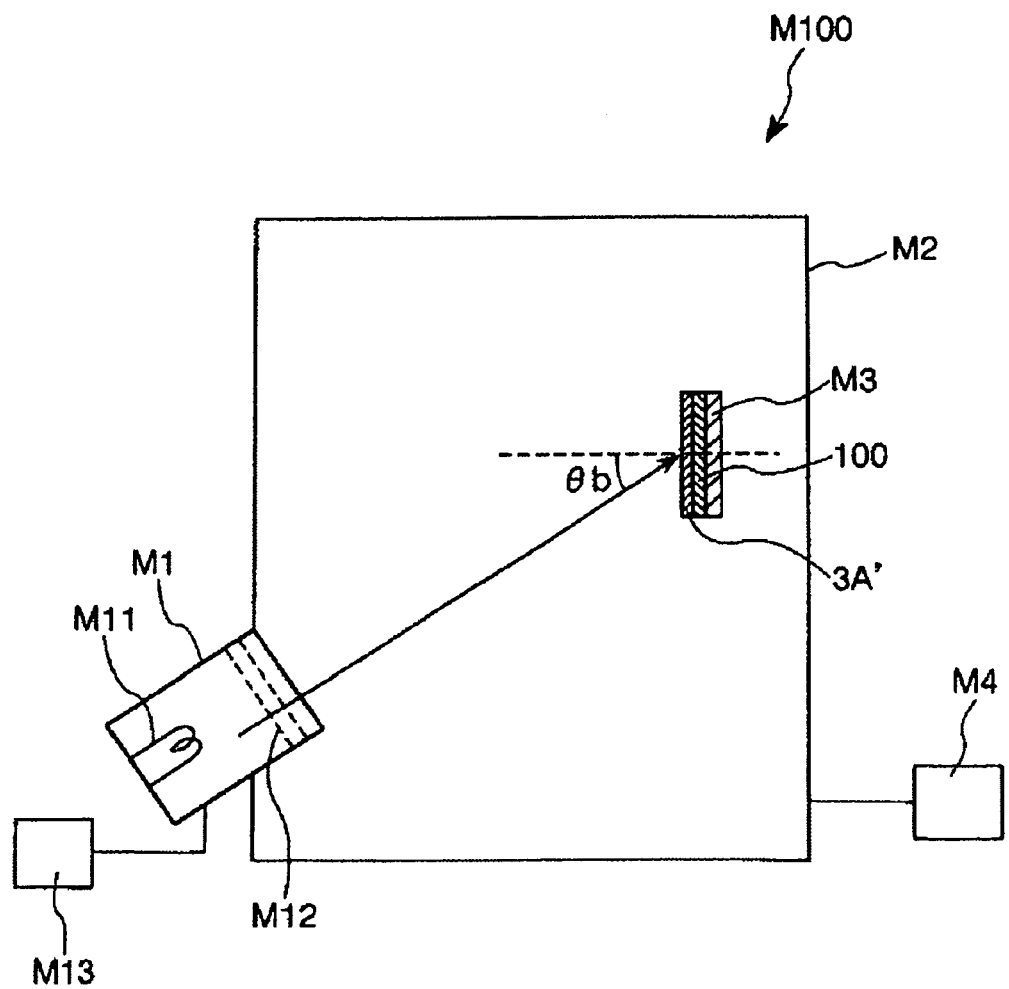
FIG. 6 is a schematic view of a milling device which is used to form concave portions in the film.

FIG. 6 is a schematic view of a milling device which is used to form the concave portions in the base substrate.

The milling device M100 shown in FIG. 6 has an ion source M1, a vacuum chamber M2, a base substrate holder M3 for fixing the base substrate on which the film made substantially of the inorganic material is formed in the vacuum chamber M2, and an air pump M4 for controlling a pressure within the vacuum chamber M2.

The ion source M1 has a filament M11 therein, and a leading out electrode M12. Further, the ion source M1 is connected to a gas supply source M13 for supplying gas into the ion source M1.

A case of forming the concave portions 31 on the film 3A' using such a milling device will now be schematically described.

1. In the base substrate holder M3, the base substrate 100 on which the film 3A' is formed is provided such that the substrate 9 contacts the base substrate holder M3.

2. A pressure within the vacuum chamber M2 is reduced by the air pump M4.

3. Gas is supplied from the gas supply source M13 into the ion source M1.

4. A voltage is applied to the filament M11 from a power source (not shown), such that hot electrons are generated.

5. The generated hot electrons collide against introduced gas, and the gas is ionized, such that plasmas (ions) are generated.

6. An acceleration voltage of ions is applied to the leading-out electrode M12, and the ions are accelerated, such that ion beams are irradiated toward the film 3A' formed on the base substrate 100.

7. The irradiated ion beams collide against the film 3A' from a direction inclined at an angle of $\theta_b$ with respect to a direction vertical to a surface of the film 3A'.

8. At portions on the film 3A' onto which the ion beams are irradiated, the concave portions 31 are formed, and the inorganic alignment film 3A is formed on the base substrate 100.

Moreover, the base substrate holder M3 is moved or rotated in advance such that the ion beams irradiated from the ion source M1 collide against the surface of the film 3A' formed on the base substrate 100 from a direction inclined at a predetermined angle (a collision angle) $\theta_b$ with respect to a direction orthogonal to the surface. Alternatively, the base substrate holder M13 may be moved or rotated by the collision angle $\theta_b$ while the ion beams are irradiated.

As described above, in the method of forming an inorganic alignment film according to the present invention, in the milling step, the ion beams are irradiated onto the surface of the film made substantially of the inorganic material from a direction inclined at the predetermined angle (the collision angle) $\theta_b$ with respect to a direction vertical to the surface. Therefore, it is possible to form the concave portions having a predetermined directivity as described above more efficiently. As a result, it is possible to allow a suitable pretilt angle to be expressed.

The collision angle $\theta_b$ is not specifically limited, and is preferably 2° or more. Thus, the above-mentioned effects become more remarkable. To the contrary, if the collision angle $\theta_b$ is too small, it may be difficult to arrange directivity of the concave portions 31 to be formed in order. Meanwhile, if the collision angle $\theta_b$ is too large, efficiency for forming the concave portions 31 may be lowered, and further it may be difficult to sufficiently increase the alignment property of the obtained inorganic alignment film 3A. Further, it may be difficult to make a relatively large pretilt angle.

In the present step, the current of the ion beams to be irradiated is preferably 100 to 1000 mA, and more preferably 500 to 800 mA. Thus, it is possible to more efficiently form a plurality of concave portions 31 at random positions on the film 3A'. As a result, it is possible to improve a regulation ability of the inorganic alignment film 3A to the alignment properties of the liquid crystal molecules. To the contrary, if the ion beam current is less than the above-mentioned upper limit value, it may be difficult to sufficiently form the plurality of concave portions 31 according to an acceleration voltage or an irradiation time of the ion beams. Meanwhile, if the current of the ion beams exceeds the above-mentioned upper limit value, adjacent concave portions 31 may be joined together according to the acceleration voltage or the irradiation time of the ion beams. As a result, the regulation ability of the inorganic alignment film 3A on the alignment properties of the liquid crystal molecules may be reduced.

The acceleration voltage of the ion beams is preferably 400 to 1400 V, and more preferably, 600 to 1400 V. Thus, it is possible to more efficiently form the concave portions 31 each having a suitable inclined surface. To the contrary, if the acceleration voltage is less than the above-mentioned lower limit value, concave portions 31 having a sufficient size may not be formed. Further, if the acceleration voltage exceeds the above-mentioned upper limit value, it may be difficult to control the shapes of the concave portions 31.

A pressure within the vacuum chamber M2, that is, the pressure of an atmosphere in the vicinity of the film 3A' in the present step is preferably $5.0 \times 10^{-1}$ Pa or less, and more preferably, $5.0 \times 10^{-2}$ Pa or less. Thus, it is possible to improve the rectilinearity of the ion beams, and further it is possible to more efficiently form the concave portions 31, each having an inclined surface of a suitable angle. To the contrary, if the pressure of the atmosphere exceeds the above-mentioned upper limit value, the rectilinearity of the ion beams may be lowered. Further, it may be difficult to control the shapes of the concave portions 31 to be formed.

As described above, in the method of forming an inorganic alignment film according to the present invention, by controlling conditions of the milling step (the irradiation of the ion beams), it is possible to form the concave portions on a surface of the film which constitutes the inorganic alignment film more surely. That is, by only forming the film before the film-forming of the inorganic alignment film and after the formation of the concave portions in the transparent conductive film which is the base substrate, it is unlikely that the concave portions having a desired shape are obtained.

Moreover, in the present embodiment, a case in which the sputter particles are irradiated in a direction substantially orthogonal to the base substrate 100 is described, but the sputter particles may be irradiated from an inclined direction. If the sputter particles are irradiated from the inclined direction, it is possible to design an additional improvement of the alignment properties of the liquid crystal molecules, and further it is possible to allow the suitable pretilt angle to be expressed.

Further, prior to forming the film 3A', the milling step (the irradiation of the ion beams) as described above may be performed to the base substrate 100. That is, the milling step may be performed to the base substrate 100 before the film 3A' is formed or after the film 3A' is formed. Thus, it is possible to make the surface of the inorganic alignment film 3A in a shape with which the liquid crystal molecules are more easily aligned.

As described above, a case of forming the inorganic alignment film 3A is described, but the inorganic alignment film 4A can also be formed similarly.

Next, a second embodiment of a liquid crystal panel according to the present invention will be described.

Figure 7:
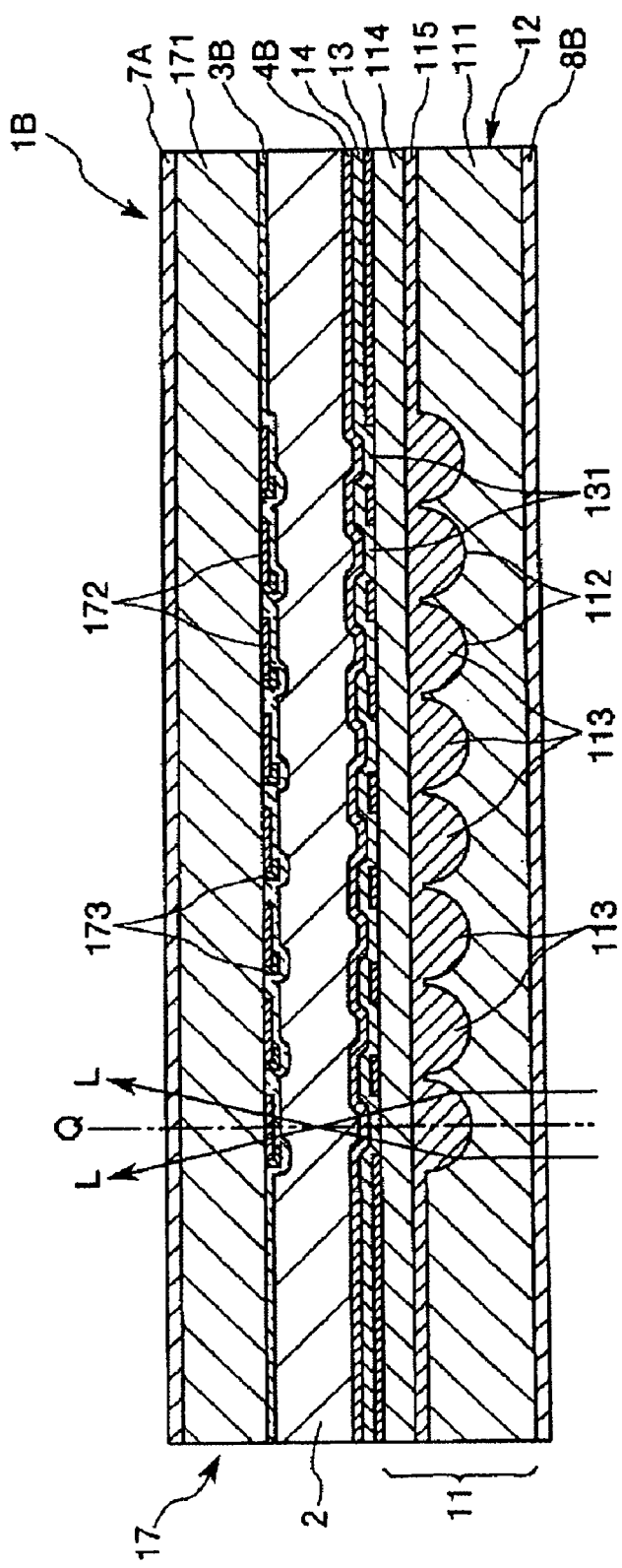
FIG. 7 is a schematic longitudinal cross-sectional view showing a second embodiment of a liquid crystal panel according to the present invention.

FIG. 7 is a schematic longitudinal cross-sectional view showing a second embodiment of a liquid crystal panel according to the present invention. Hereinafter, as regards the liquid crystal panel 1B shown in FIG. 7, differences from the first embodiment will be described, and the descriptions on the elements common to the first embodiment will be omitted.

As shown in FIG. 7, the liquid crystal panel (a TFT liquid crystal panel) 1B has a TFT substrate (a liquid crystal driving substrate) 17, an inorganic alignment film 3B bonded to the TFT substrate 17, a counter substrate 12 for a liquid crystal panel, an inorganic alignment film 4B bonded to the counter substrate 12 for a liquid crystal panel, a liquid crystal layer 2 made of liquid crystal which is filled into a space between the inorganic alignment film 3B and the inorganic alignment film 4B, a polarizing film 7B bonded to an outer surface of the TFT substrate (the liquid crystal driving substrate) 17 (a surface opposite to a surface facing the inorganic alignment film 3B), and a polarizing film 8B bonded to an outer surface of the counter substrate 12 for a liquid crystal panel (a surface opposite to a surface facing the inorganic alignment film 4B). The inorganic alignment films 3B and 4B are formed by the same forming method (the method of forming an inorganic alignment film according to the present invention) as that of the inorganic alignment films 3A and 4A in the above-mentioned first embodiment, and the polarizing films 7B and 8B are the same as the polarizing films 7A and 8A described in the first embodiment.

The counter substrate 12 for a liquid crystal panel has a microlens substrate 11, a black matrix 13 provided on an outer layer 114 of the microlens substrate 11, in which openings 131 are formed, and a transparent conductive film (a common electrode) 14 provided to cover the black matrix 13 on the outer layer 114.

The microlens substrate 11 has a concave portion including substrate 111 for a microlens (a first substrate) provided with plural (numerous) concave portions (concave portions for the microlenses) 112 each having a concave surface, and the outer layer (a second substrate) 114 bonded to a surface, on which the concave portions 112 of the substrate 111, via a resin layer (an adhesive layer) 115. Further, in the resin layer 115, microlenses 113 are formed by a resin filled into the concave portions 112.

The substrate 111 is made from a flat plate-shaped main material (a transparent substrate), and plural (numerous) concave portions 112 are formed in its surface. The concave portions 112 can be formed, for example, by a dry etching method, a wet etching method or the like using a mask.

The substrate 111 is made of, for example, glass.

A thermal expansion coefficient of the main material is preferably approximately equal to the thermal expansion coefficient of a glass substrate 171 (for example, a ratio of the thermal expansion coefficients of them is about 0.1 to 10). Thus, it is possible to prevent curving, bending, detachment or the like due to a difference of the thermal expansion coefficients when a temperature is changed in the resulting liquid crystal panel.

From this point of view, the substrate 111 and the glass substrate 171 are preferably made of the same material. Thus, it is possible to effectively prevent curving, bending, detachment or the like due to the difference of the thermal expansion coefficients during the change of temperature.

In particular, in the case in which the microlens substrate 11 is used for the TFT liquid crystal panel of high temperature polysilicon, the concave portion including substrate 111 is preferably made of quartz glass. The TFT liquid crystal panel has the TFT substrate as the liquid crystal driving substrate. As such a TFT substrate, quartz glass having a property which is minimally changed by a manufacturing environment is preferably used. For this reason, in correspondence with the TFT substrate, the substrate 111 is also made of quartz glass, such that it is possible to obtain the TFT liquid crystal panel in which curving, bending or the like is unlikely and which has excellent stability.

On the upper surface of the substrate 111, a resin layer (an adhesive layer) 115 is provided to cover the concave portions 112.

By filling the material of the resin layer 115, the microlenses 113 are formed in the concave portions 112.

The resin layer 115 may be made of, for example, resin (adhesive) having a refractive index higher than the refractive index of the material of the substrate 111. For example, the resin layer 115 may be suitably made of an ultraviolet curable resin such as an acrylic resin, an epoxy resin, an acrylic epoxy resin.

On the upper surface of the resin layer 115, the flat plate-shape outer layer 114 is provided. The outer layer (a glass layer) 114 may be made of, for example, glass. In this case, the thermal expansion coefficient of the outer layer 114 is preferably approximately equal to the thermal expansion coefficient of the substrate 111. For example, a ratio of the thermal expansion coefficients of them is preferably about 0.1 to 10. Thus, it is possible to prevent curving, bending or the like due to the difference of the thermal expansion coefficients of the substrate 111 and the outer layer 114. Such an effect can be more effectively obtained by making the substrate 111 and the outer layer 114 with the same material.

From a point of view for obtaining necessary optical properties when the microlens substrate 11 is used for the liquid crystal panel, the thickness of the outer layer 114 is normally about 5 to 1000 μm, and more preferably, 10 to 150 μm.

Moreover, the outer layer (a barrier layer) 114 may be made of, for example, ceramics. Moreover, as such ceramics, for example, nitride-based ceramics containing AlN, SiN, TiN and BN, oxide-based ceramics containing $Al_2O_3$ and $TiO_2$, and carbide-based ceramics containing WC, TiC, ZrC, TaC may be included. When the outer layer 114 is made of ceramics, the thickness of the outer layer 114 is not specifically limited, but it is preferably 20 nm to 20 μm, and more preferably, 40 nm to 1 μm.

In addition, if necessary, the outer layer 114 may be omitted.

The black matrix 13 has a light-shielding function and is made of, for example, a metallic material such Cr, Al, Al alloy, Ni, Zn, Ti and so on, or a resin in which carbon or titanium is distributed.

The transparent conductive film 14 has a conductive property and is made of, for example, indium tin oxide (ITO), indium oxide (IO), tin oxide ($SnO_2$).

The TFT substrate 17 is a substrate for driving the liquid crystal of the liquid crystal layer 2, and comprises a glass substrate 171, plural (numerous) pixel electrodes 172 provided on the glass substrate 171 and arranged in a matrix, and plural (numerous) thin film transistors (TFTs) 173 corresponding to the respective pixel electrode 172. In FIG. 7, a sealing material, wiring lines, and so on are omitted.

The glass substrate 171 is preferably made of quartz glass for the above-mentioned reason.

The pixel electrode 172 drives the liquid crystal of the liquid crystal layer 2 by charging and discharging between the transparent conductive film (the common electrode) 14 and the pixel electrode 172. The pixel electrode 172 is made of, for example, the same material as that of the above-mentioned transparent conductive film 14.

The thin film transistor 173 is connected to the nearby corresponding pixel electrode 172. Further, the thin film transistor 173 is connected to a control circuit which is not shown, and controls a current to be supplied to the pixel electrode 172. Thus, the charging and discharging of the pixel electrode 172 is controlled.

The inorganic alignment film 3B is bonded to the pixel electrodes 172 of the TFT substrate 17, and the inorganic alignment film 4B is bonded to the transparent conductive film 14 of the counter substrate 12 for a the liquid crystal panel.

The liquid crystal layer 2 contains the liquid crystal molecules, and corresponding to the charging and discharging of the pixel electrode 172, the alignment of such liquid crystal molecules, that is, the liquid crystal changes.

In such a liquid crystal panel 1B, one pixel normally comprises one microlens 113, one opening 131 of the black matrix 13 corresponding to an optical axis of the microlens 113, one pixel electrode 172, and one thin film transistor 173 connected to the pixel electrode 172.

An incident light L from the counter substrate 12 for a liquid crystal panel passes through the substrate 111, is condensed while passing through the microlens 113, and transmits the resin layer 115, the outer layer 114, the opening 131 of the black matrix 13, the transparent conductive film 14, the liquid crystal layer 2, the pixel electrode 172, and the glass substrate 171. At this time, since the polarizing film 8B is provided at the incident side of the microlens substrate 11, the incident light L is linearly polarized when transmitting the liquid crystal layer 2. In this case, the polarizing direction of the incident light L is controlled corresponding to the alignment state of the liquid crystal molecules of the liquid crystal layer 2. Therefore, by allowing the incident light L transmitted the liquid crystal panel 1B to transmit the polarizing film 7B, it is possible to control the brightness of emitting light.

As described above, the liquid crystal panel 1B has the microlens 113, and additionally the incident light L passed through the microlens 113 is condensed and passes through the opening 131 of the black matrix 13. Meanwhile, in portions of the black matrix 13 at which the openings 131 are not formed the incident light L is shielded. Therefore, in the liquid crystal panel 1B, leaking of unnecessary light from portions other than the pixels is prevented, and the attenuation of the incident light L in the pixel portions is suppressed. For this reason, the liquid crystal panel 1B has high transmittance in the pixel portions.

The liquid crystal panel 1B can be manufactured, for example, by forming the inorganic alignment films 3B and 4B on the TFT substrate 17 and the counter substrate 12 for a liquid crystal panel (manufactured with a known method), respectively, joining both substrates via a sealing material (not shown), injecting liquid crystal from a filling hole (not shown) into a space defined both substrates, and then closing up the filling hole.

Moreover, in the above-mentioned liquid crystal panel 1B, the TFT substrate is used as the liquid crystal driving substrate, but liquid crystal driving substrates other than the TFT substrate, for example, a TFD substrate, an STN substrate or the like may be used for the liquid crystal driving substrate.

The liquid crystal panel comprising the above-mentioned inorganic alignment film can be suitably used for devices having an intensive light source or to be used outdoors.

Next, an electronic apparatus (a liquid crystal display device) comprising the above-mentioned liquid crystal panel 1A will be described in detail with reference to FIGS. 8 to 10.

Figure 8:
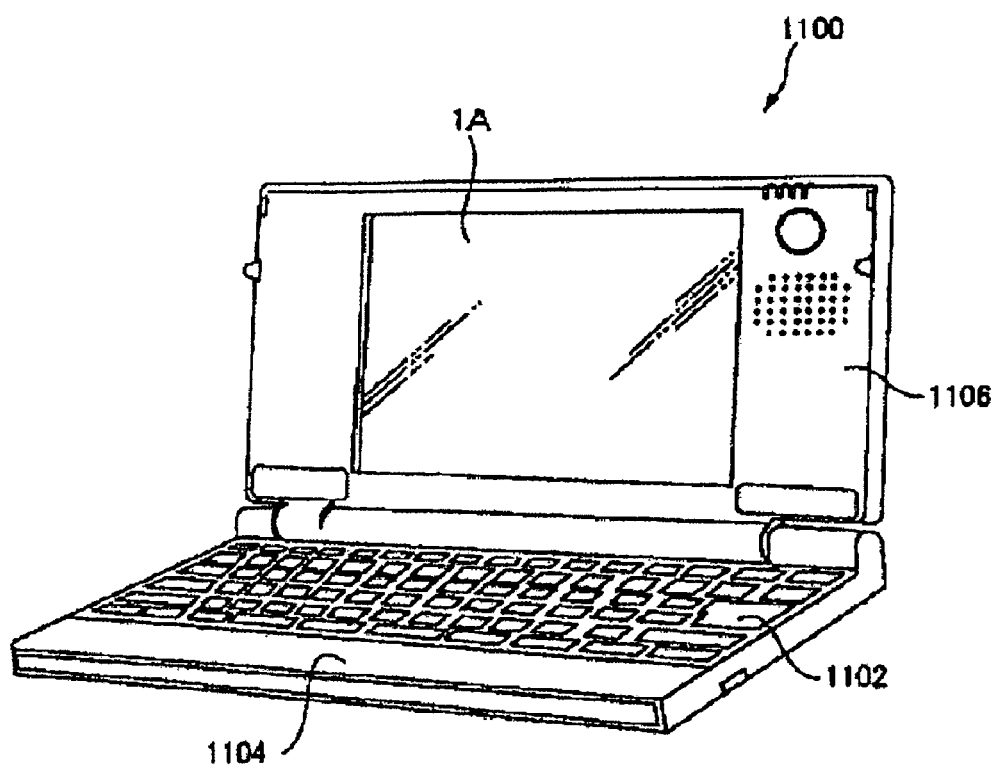
FIG. 8 is a perspective view showing a construction of a mobile or notebook personal computer to which an electronic apparatus according to the present invention is applied.

FIG. 8 is a perspective view showing a construction of a portable (notebook) personal computer to which an electronic apparatus according to the present invention is applied.

In FIG. 8, a personal computer 1100 comprises a main body portion 1104 provided with a keyboard 1102, and a display unit 1106. The display unit 1106 is rotatably supported via a hinge structure with respect to the main body portion 1104.

In the personal computer 1100, the display unit 1106 comprises the above-mentioned liquid crystal panel 1A and a backlight which is not shown. An image (information) can be displayed by allowing light from the backlight to transmit the liquid crystal panel 1A.

Figure 9:
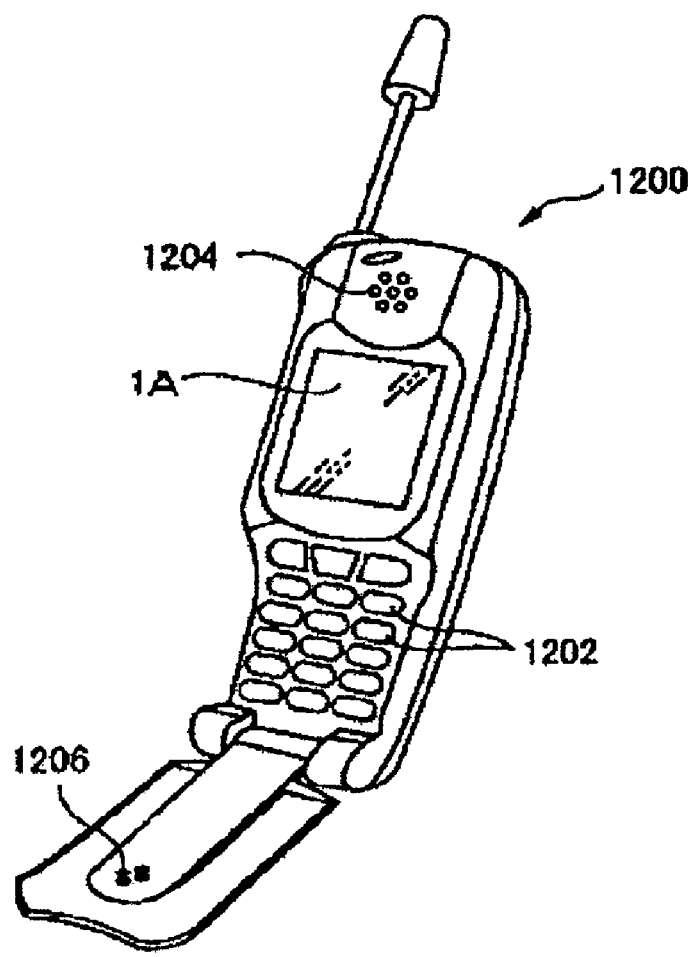
FIG. 9 is a perspective view showing a construction of a cellular phone, also including a Personal Handyphone System (PHS), to which an electronic apparatus according to the present invention is applied.

FIG. 9 is a perspective view showing a construction of a cellular phone (also including a PHS) to which an electronic apparatus according to the present invention is applied.

In FIG. 9, the cellular phone 1200 comprises a plurality of operating buttons 1202, a receiver 1204 and a transmitter 1206. In addition, the cellular phone 1200 comprises the above-mentioned liquid crystal panel 1A and a backlight which is not shown.

Figure 10:
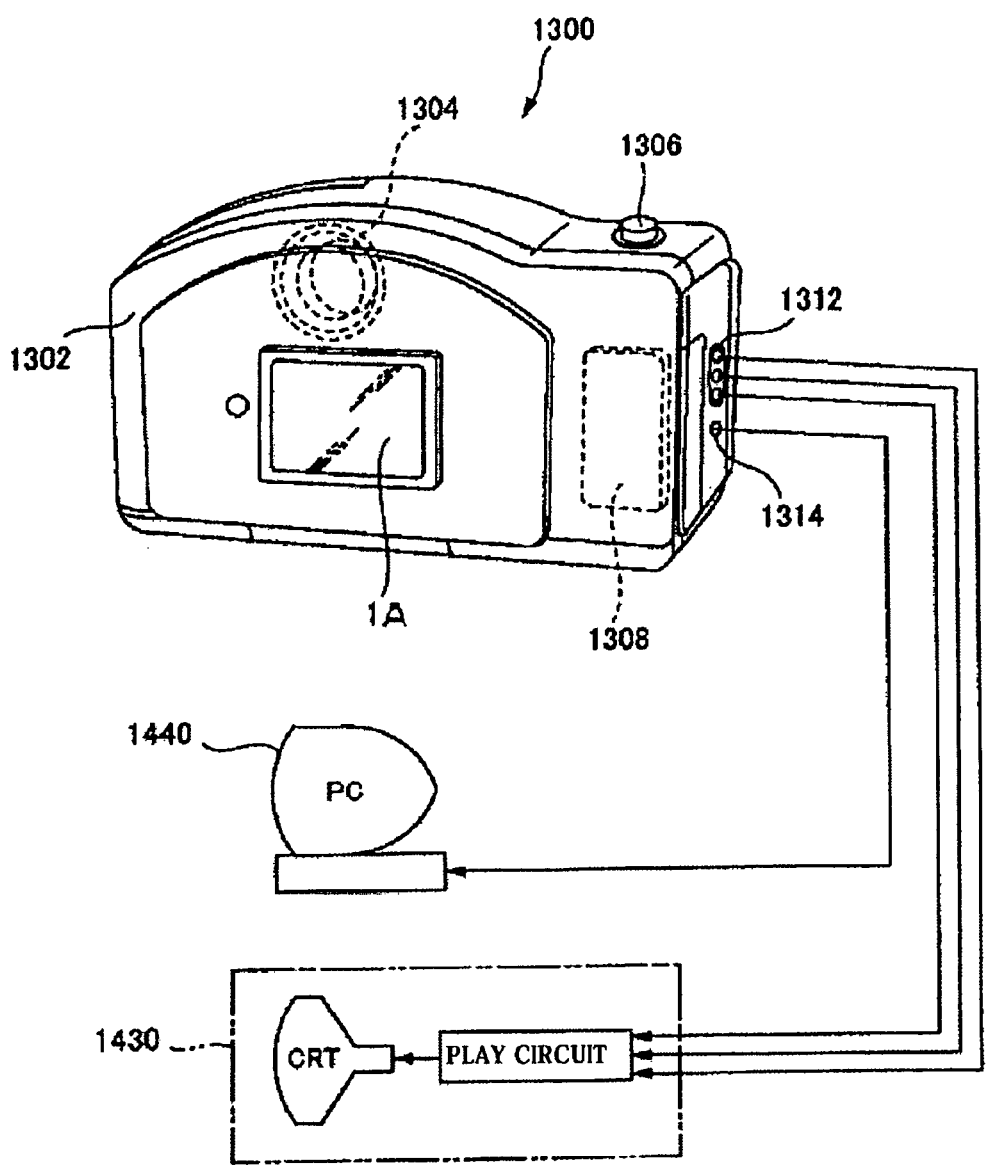
FIG. 10 is a perspective view showing a construction of a digital still camera to which an electronic apparatus according to the present invention is applied.

FIG. 10 is a perspective view showing a construction of a digital still camera to which an electronic apparatus according to the present invention is applied. Moreover, in FIG. 10, connections of the digital still camera with exterior apparatuses are simply shown.

Here, a typical camera exposes a photographic film by the optical image of a subject for photography, while the digital still camera 1300 photoelectrically converts the optical image of the subject for photography using an image pickup element such as a CCD (a charge coupled device) and generates an image pickup signal (image signal).

In the digital still camera 1300, the above-mentioned liquid crystal panel 1A and a backlight (not shown) are provided on the rear surface of a case (a body) 1302, such that a display is preformed based on the image pickup signal by the CCD. The liquid crystal panel 1A functions as a finder for displaying the subject for photography as an electronic image.

Inside the case, a circuit board 1308 is arranged. On the circuit board 1308, a memory for storing (memorizing) the image pickup signal is arranged.

Further, on a front surface of the case 1302 (a rear surface in the shown construction), a light receiving unit 1304 including an optical lens (an image pickup optical system) or the CCD is provided.

If a photographer confirms an image of the subject for photography displayed on the liquid crystal panel 1A and presses a shutter button 1306, the image pickup signal of the CCD at that point of time is transferred and stored to the memory of circuit board 1308.

Further, in the digital still camera 1300, a video signal output terminal 1312 and an input/output terminal 1314 for data communication are provided on a side surface of the case 1302.

As shown in FIG. 10, as occasion demands, a television monitor 1430 is connected to the video signal output terminal 1312, and a personal computer 1440 is connected to the input/output terminal 1314 for data communication, respectively. In addition, by a predetermined operation, the image pickup signal stored in the memory of the circuit board 1308 is outputted to the television monitor 1430 or the personal computer 1440.

Next, as an example of an electronic apparatus according to the present invention, an electronic apparatus (a liquid crystal projector) using the above-mentioned liquid crystal panel 1B will be described.

Figure 11:
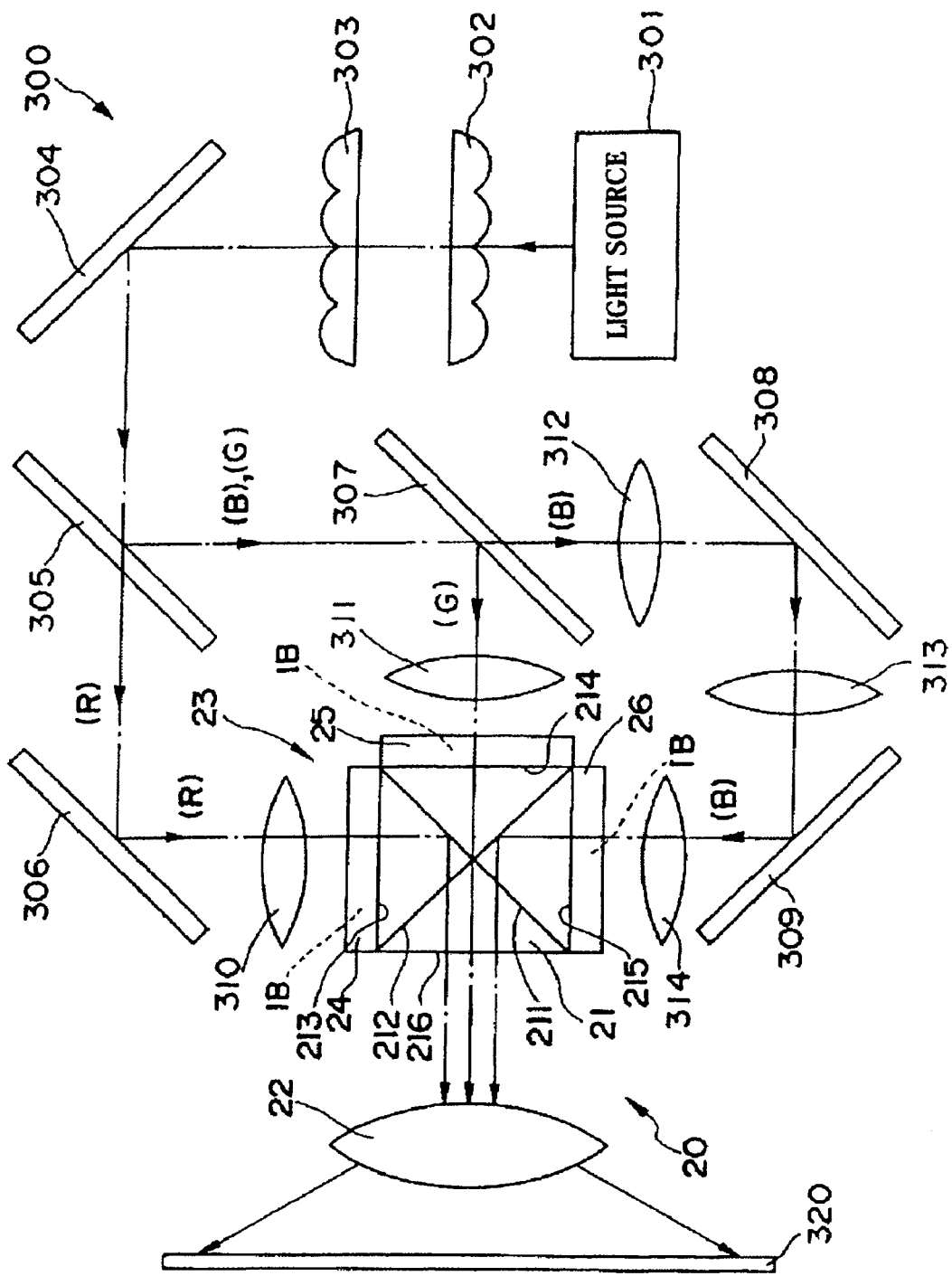
FIG. 11 is a view showing schematically an optical system of a projective display device to which an electronic apparatus according to the present invention is applied.

FIG. 11 is a view schematically showing an optical system of an electronic apparatus (a projection display device) according to the present invention.

As shown in FIG. 11, a projection display device 300 comprises a light source 301, an irradiating optical system provided with a plurality of integrator lenses, a color separating optical system (a light guiding optical system) provided with a plurality of dichroic mirrors and so on, a (red) liquid crystal light valve (a liquid crystal light shutter array) 24 corresponding to red, a (green) liquid crystal light valve (a liquid crystal light shutter array) 25 corresponding to green, a (blue) liquid crystal light valve (a liquid crystal light shutter array) 26 corresponding to blue, a dichroic prism (a color synthesizing optical system) 21 on which a dichroic mirror surface 211 reflecting only red light component and a dichroic mirror surface 212 reflecting only blue light component, and a projective lens (a projecting optical system) 22.

Further, the irradiating optical system has integrator lenses 302 and 303. The color separating optical system has mirrors 304, 306 and 309, a dichroic mirror 305 for reflecting blue light component and green light component (transmitting only red light component), a dichroic mirror 307 for reflecting the green light component, a dichroic mirror 308 for reflecting only the blue light component (or a mirror reflecting the blue light component), and condensing lenses 310, 311, 312, 313 and 314.

The liquid crystal light valve 25 is provided with the above-mentioned liquid crystal panel 1B. The liquid crystal light valves 24 and 26 have the same construction as the liquid crystal light valve 25. The liquid crystal panels 1B comprised in the respective liquid crystal light valves 24, 25 and 26 are respectively connected to driving circuits which are not shown.

Moreover, in the projection display device 300, an optical block 20 is comprised of the dichroic prism 21 and the projective lens 22. Further, a display unit 23 is comprised of the optical block 20, and the liquid crystal light valves 24, 25 and 26 fixedly arranged to the dichroic prism 21.

Hereinafter, an action of the projection display device 300 will be described.

A white light component (a white light flux) emitted from the light source 301 transmits the integrator lenses 302 and 303. An optical intensity of the white light component (a brightness distribution) is equalized by the integrator lenses 302 and 303. The white light emitted from the light source 301 preferably has a relatively high optical intensity. Thus, it is possible to make an image to be formed on a screen 320 more bright. Further, since the liquid crystal panel 1B having excellent light resistance is used in the projection display device 300, it is possible to maintain stability for a long time even when the light emitted from the light source 301 has a high intensity.

The white light components transmitted the integrator lenses 302 and 303 are reflected to a left side of FIG. 11 in the mirror 304. Among the reflected light components, the blue light component (B) and the green light component (G) are respectively reflected to a lower side of FIG. 11 in the dichroic mirror 305, and the red light component (R) transmits the dichroic mirror 305.

The red light component transmitted the dichroic mirror 305 is reflected to a lower side of FIG. 11 in the mirror 306, and the reflected light is shaped by the condensing lens 310 and incident to the red liquid crystal light valve 24.

Between the blue light component and the green light component reflected in the dichroic mirror 305, the green light component is reflected to a left side of FIG. 11 in the dichroic mirror 307, and the blue light component transmits the dichroic mirror 307.

The green light component reflected in the dichroic mirror 307 is shaped by the condensing lens 311 and incident to the green liquid crystal light valve 25.

Further, the blue light component transmitted the dichroic mirror 307 is reflected to a left side of FIG. 11 in the dichroic mirror (or mirror) 308, and then the reflected light is reflected to an upper side of FIG. 11 in the mirror 309. The blue light component is shaped by the condensing lenses 312, 313 and 314 and incident to the blue liquid crystal light valve 26.

As described above, the white light component emitted from the light source 301 is separated into three primary colors of red, green and blue by the color separating optical system, and the respective separated light components are guided and incident to the corresponding liquid crystal light valve.

At this time, the respective pixels (the thin film transistors 173 and the pixel electrodes 172 connected thereto) of the liquid crystal panel 1B comprised in the liquid crystal light valve 24 are switchably controlled (on/off) by the driving circuit (driving means) which operates based on the red image signal, that is, modulated.

Similarly, the green light component and the blue light component are respectively incident to the liquid crystal light valves 25 and 26, and modulated in the respective liquid crystal panels 1B, such that the green image and the blue image are respectively formed. At this time, the respective pixels of the liquid crystal panel 1B comprised in the liquid crystal light valve 25 are switchably controlled by the driving circuit which operates based on the green image signal, and the respective pixels of the liquid crystal panel 1B comprised in the liquid crystal light valve 26 are switchably controlled by the driving circuit which operates based on the blue image signal.

Thus, the red light component, the green light component and the blue light component are respectively modulated in the liquid crystal light valves 24, 25 and 26, such that the red image, the green image and the blue image are respectively formed.

The red image formed by the above-mentioned liquid crystal light valve 24, that is, the red light component from the light crystal light valve 24 is incident to the dichroic prism 21 from a surface 213, is reflected to a left side of FIG. 11 in the dichroic mirror surface 211, transmits the dichroic mirror surface 212, and is emitted from the emitting surface 216.

Further, the green image formed by the above-mentioned liquid crystal light valve 25, that is, the green light component from the liquid crystal light valve 25 is incident to the dichroic prism 21 from a surface 214, transmits the dichroic mirror surfaces 211 and 212 respectively, and is emitted from the emitting surface 216.

Further, the blue image formed by the above-mentioned liquid crystal light valve 26, that is, the blue light component from the liquid crystal light valve 26 is incident to the dichroic prism 21 from a surface 215, is reflected to a left side of FIG. 11 in the dichroic mirror surface 212, transmits the dichroic mirror surface 211, and is emitted from the emitting surface 216.

As described above, the respective color light components from the above-mentioned liquid crystal light valves 24, 25 and 26, that is, the respective images formed by the liquid crystal light valves 24, 25 and 26 are synthesized by the dichroic prism 21, such that a color image is formed. The image is projected (magnified and projected) on the screen 320 arranged at a predetermined position by the projective lens 22.

Moreover, an electronic apparatus according to the present invention may include electronic apparatuses other than the personal computer (the portable personal computer) of FIG. 8, the cellular phone of FIG. 9, the digital still camera of FIG. 10 and the projection display device of FIG. 11. For example, a television, a video camera, a view finder type or monitor-direct-view type video tape recorder, a car navigation device, a pager, an electronic organizer (including one with a communication function), an electronic dictionary, an electronic calculator, an electronic game machine, a word processor, a video phone, a television monitor for security, electronic binoculars, a workstation, a POS terminal, an apparatus with a touch panel (for example, cash dispenser of a financial organization, an automated ticket vending machine), a medical apparatus (for example, an electronic thermometer, a sphygmomanometer, a blood sugar meter, an electrocardiogram display device, an ultrasonic diagnosis apparatus, an endoscopic display device), a fish finder, various measurement instruments, meters (for example, meters of a vehicle, an aircraft or a vessel), a flight simulator may be included. It is needless to say that the above-mentioned liquid crystal panel according to the present invention can be applied as a display unit or a monitor unit of these electronic apparatuses.

As described above, the inorganic alignment film, the substrate for electronic device, the liquid crystal panel, the electronic apparatus and the method of forming the inorganic alignment film are described based on the embodiments shown in the drawings, but the present invention is not limited to the embodiments.

For example, in the method of forming the inorganic alignment film according to the present invention, one or more processes for an optional purpose may be added. Further, in the substrate for electronic device, the liquid crystal panel and the electronic apparatus, each element may be substituted with an optional element exhibiting the same function. In addition, an optional element may be added.

Further, in the above-mentioned embodiments, a case of forming a film by applying the ion beam sputtering method is described, but a magnetron sputtering method, a long range sputtering method in which a distance between a target and a base substrate is relatively long or the like may be applied.

Further, in the above-mentioned embodiments, the projection display device (the electronic apparatus) having three liquid crystal panels to which the liquid crystal panel according to the present invention (a liquid crystal panel of which the inorganic alignment film contains an optical stabilization agent) is applied is described. However, alternatively, less than three panels may be made of the liquid crystal panel according to the present invention. In this case, the present invention is preferably applied to at least the blue liquid crystal panel.

EXAMPLES

Manufacture of Liquid Crystal Panel

As described below, the liquid crystal panel is manufactured as shown in FIG. 7.

Example 1

First, as described below, the microlens substrate is manufactured.

A non-processed quartz glass substrate (a transparent substrate) having a thickness of 1.2 mm is prepared as a parent material. Then, by dipping the substrate into a cleaning solvent (a mixture solution of sulphuric acid and oxygenated water) of 85° C., a cleaning process for cleaning the surface of the substrate is performed.

Subsequently, on the front and rear surfaces of the quartz glass substrate, a film of polycrystalline silicon having a thickness of 0.4 µm is formed by the CVD method.

Subsequently, in the formed polycrystalline silicon film, openings corresponding to the concave portions to be formed are formed.

This is preformed as follows. First, a resist layer having a pattern of the concave portions to be formed is formed on the polycrystalline silicon. Next, a dry etching by a CF gas is performed to the polycrystalline silicon to form the openings. Next, the resist layer is removed.

Next, a wet etching (at etching temperature of 30° C.) is performed by dipping the quartz glass substrate into an etching solution (a mixture aqueous solution of 10 percent by weight of fluoric acid and 10 percent by weight of glycerin for 120 minutes, such that the concave portions are formed on the quartz glass substrate.

Subsequently, by dipping the quartz glass substrate into 15 percent by weight of tetramethyl ammonium hydroxide aqueous solution for five minutes, the polycrystalline silicon film formed on the front and rear surfaces is removed, such that the concave portion including substrate for a microlens is obtained.

Next, on a surface of the concave portion including substrate for a microlens on which the concave portions are formed, an ultraviolet (UV) curable acrylic optical adhesive (a refractive index of 1.60) is coated with no bubble. Subsequently, a cover glass (an outer layer) of quartz glass is bonded to the optical adhesive, and then the optical adhesive is cured by an irradiation of ultraviolet rays, such that a laminated structure is obtained.

Subsequently, by removing and polishing the cover glass to a thickness of 50 µm, the microlens substrate is obtained.

Moreover, in the obtained microlens substrate, the thickness of the resin layer is 12 µm.

To the obtained microlens substrate, the light-shielding film (Cr film) having a thickness of 0.16 µm, that is, a black matrix is formed using the sputtering method and the photolithography method, the light-shielding layer being provided with openings at positions corresponding to the microlenses of the cover glass. In addition, the ITO film (the transparent conductive film) having a thickness of 0.15 µm is formed on the black matrix by the sputtering method, such that the counter substrate (the base substrate) for liquid crystal panel is manufactured.

Next, the inorganic alignment film is formed through a first milling step, a film-forming step and a second milling step as described below.

Film-Forming Step

On the transparent conductive film of the counter substrate for liquid crystal panel obtained in such a manner, a film made of an inorganic material (SiO$_2$) is formed using the device shown in FIG. 5 as described below.

First, the counter substrate for the liquid crystal panel is provided in the base substrate holder S5 within the vacuum chamber S3, and the pressure of the vacuum chamber S3 is reduced to 1×10$^{-4}$ Pa by the air pump S4.

Next, argon gas is supplied from the gas supply source S13 into the ion source S1, and a voltage is applied to the filament S11, such that plasmas (ions) are generated. Then, an ion acceleration voltage of 200 V is applied to the leading-out electrode S12, and the ions are accelerated, such that the ions are irradiated onto the target S2 as the ion beams. Moreover, as the target S2, SiO$_2$ is used.

When the ion beams is irradiated, the target S2 irradiated sputter particles toward the counter substrate for liquid crystal panel, such that the film made of SiO$_2$ having an average thickness of 0.05 μm is formed on the transparent conductive film. Moreover, the irradiation angle $\theta_s$ of the sputter particles is 3.5°. Further, when forming the film, a temperature of the counter substrate for liquid crystal panel is 80° C.

Further, on the surface of the TFT substrate (the quartz glass) separately prepared, a film is also formed similarly to the above-mentioned method.

Milling Step

Next, the concave portions are formed in the surface of the film formed on the counter substrate for liquid crystal panel using the milling device M100 shown in FIG. 6, such that the inorganic alignment film is formed.

First, the counter substrate for liquid crystal panel with the SiO$_2$ film formed thereon is provided in the base substrate holder M3 within the vacuum chamber M2, and the pressure of the vacuum chamber is reduced to 1×10$^{-4}$ Pa by the air pump M4.

Next, argon gas is supplied from the gas supply source M13 into the ion source M1, and a voltage is applied to the filament M11, such that plasmas are generated. Then, an ion acceleration voltage of 600 V is applied to the leading-out electrode M12, the ions are accelerated, such that the ions are irradiated onto the SiO$_2$ film as ion beams. Moreover, the collision angle of the ion beams against the SiO$_2$ film is 3°.

Moreover, the angle $\theta_d$ of each of the inclined surfaces of the concave portions formed is 3 to 5°. In addition, the average width W$_1$ of the concave portions in the inclination direction of the inclined surface of the concave portions is 10 nm, and the average width W$_2$ of the concave portions in a direction orthogonal to the above-mentioned inclination direction is 10 nm. Further, the current of the ion beams is 500 mA.

In such a manner, the counter substrate for the liquid crystal device with the inorganic alignment film formed thereon is obtained.

Further, similarly to the above method, the TFT substrate with the inorganic alignment film formed thereon is obtained.

The counter substrate for the liquid crystal device with the inorganic alignment film formed thereon and the TFT substrate with the inorganic alignment film formed thereon obtained in such a manner are joined via the sealing material. This joining is performed such that the alignment direction of the inorganic alignment films is tilted 90° to allow the liquid crystal molecules constituting the liquid crystal layer to be left twisted.

Next, liquid crystal (MJ99247 of Merk & Co.) is injected into a space defined between the inorganic alignment film and the inorganic alignment film from a filling hole, and then the filling hole is closed. The thickness of the formed liquid crystal layer is about 3 μm.

Subsequently, to the side of the outer surface of the counter substrate for liquid crystal panel and the side of the outer surface of the TFT substrate, the polarizing film 8B and the polarizing film 7B are joined respectively, such that the TFT liquid crystal panel having a structure shown in FIG. 4 is manufactured. As the polarizing film, a film made of polyvinylalcohol (PVA) and extended in one axis direction is used. Moreover, the joining direction of the polarizing film 7B and the polarizing film 8B is determined based on the alignment direction of the inorganic alignment film 3B and the inorganic alignment film 4B. That is, the polarizing film 7B and the polarizing film 8B are joined such that incident light is transmitted when a voltage is not applied and is not transmitted when the voltage is applied.

Moreover, the pretilt angle of the manufactured liquid crystal panel is in a range of 3 to 7°.

Examples 2 and 3

Except that the inorganic alignment film made of Sio$_2$ is formed under conditions in the milling step as shown in Table 1, the liquid crystal panel is manufactured similarly to the Example 1.

Examples 4 to 6

Except that SiO is used as the target S2 and the inorganic alignment film made of SiO is formed under conditions in the milling step as shown in Table 1, the liquid crystal panel is manufactured similarly to the Example 1.

Comparative Example 1

A solution (AL6256 of JSR Corporation) of polyimide-based resin (PI) is prepared, and a film having an average thickness of 0.05 μm is formed on the counter substrate for liquid crystal panel by a spic coat method, without using the device as shown in FIGS. 5 and 6. Then, a rubbing step is performed on the film such that the pretilt angle is 2 to 3°, thereby forming an alignment film. Except that, similarly to the above-mentioned Example 1, a liquid crystal panel is manufactured. In the Comparative Example 1, at the time of the rubbing step, dust particles or the like are generated.

Comparative Example 2

Except that the milling step is not performed, a liquid crystal panel is manufactured similarly to the Example 1.

Comparative Example 3

Except that the ion beams collide against the film made of the inorganic material from a vertical direction in the milling step, a liquid crystal panel is manufactured similarly to the Example 1.

Evaluation of Liquid Crystal Panel

To the liquid crystal panels manufactured in the respective Examples and Comparative Examples, light transmittance is consecutively measured. The measurement of light transmittance is performed by setting the temperature of the respective liquid crystal panels to 50° C. and irradiating white light component of light flux density of 151 m/mm$^2$ in a state in which a voltage is not applied.

Moreover, the evaluation of the liquid crystal panels is performed with a reference which is a time (a light resistant time) at which light transmittance from the irradiation beginning of white light component of the liquid crystal panel manufactured in the Comparative Example 1 is lowered up to 50% as compared with the initial light transmittance, and is divided into four stages as follows.

⊙: The light resistant time is five or more times the Comparative Example 1.

○: The light resistant time is two to below five times the Comparative Example 1.

Δ: The light resistant time is one to below two times the Comparative Example 1.

x: The light resistant time is below the Comparative Example 1.

In Table 1, various conditions in the milling step, such as the angle $\theta_d$ of each of the inclined surfaces of the concave portions, the average widths $W_1$ and $W_2$, the average thickness of the alignment film, the pretilt angles of the respective liquid crystal panels, and evaluation results of the liquid crystal panels, are shown.

TABLE 1

| | MATERIAL FOR ALIGNMENT FILM | PRESSURE WITHIN VACUUM CHAMBER IN MILLING STEP [Pa] | COLLISION ANGLE $\theta_b$ OF ION BEAM IN MILLING STEP [°] | ACCELERATION VOLTAGE IN MILLING STEP [V] | CURRENT OF ION BEAM IN MILLING STEP [mA] | ANGLE $\theta_d$ OF INCLINED SURFACE OF CONCAVE PORTION [nm] |
|---|---|---|---|---|---|---|
| EXAMPLE 1 | $SiO_2$ | $1.0 \times 10^{-4}$ | 3 | 600 | 500 | 3 TO 5 |
| EXAMPLE 2 | $SiO_2$ | $1.0 \times 10^{-4}$ | 5 | 600 | 500 | 4 TO 5 |
| EXAMPLE 3 | $SiO_2$ | $1.0 \times 10^{-4}$ | 10 | 600 | 500 | 10 TO 15 |
| EXAMPLE 4 | SiO | $1.0 \times 10^{-4}$ | 3 | 800 | 400 | 5 |
| EXAMPLE 5 | SiO | $1.0 \times 10^{-4}$ | 5 | 800 | 400 | 8 |
| EXAMPLE 6 | SiO | $1.0 \times 10^{-4}$ | 10 | 800 | 400 | 12 |
| COMPARATIVE EXAMPLE 1 | PI | — | — | — | — | — |
| COMPARATIVE EXAMPLE 2 | $SiO_2$ | — | — | — | — | — |
| COMPARATIVE EXAMPLE 3 | $SiO_2$ | $1.0 \times 10^{-4}$ | 0 | 600 | 500 | — |

| | AVERAGE WIDTH $W_1$ OF CONCAVE PORTION [nm] | AVERAGE WIDTH $W_2$ OF CONCAVE PORTION [nm] | AVERAGE THICKNESS OF ALIGNMENT FILM [μm] | PRETILT ANGLE [°] | LIGHT RESISTANCE |
|---|---|---|---|---|---|
| EXAMPLE 1 | 10 | 10 | 0.05 | 3 TO 7 | ⊙ |
| EXAMPLE 2 | 10 | 10 | 0.05 | 3 TO 7 | ⊙ |
| EXAMPLE 3 | 10 | 10 | 0.05 | 3 TO 7 | ⊙ |
| EXAMPLE 4 | 5 | 5 | 0.05 | 3 TO 7 | ⊙ |
| EXAMPLE 5 | 5 | 5 | 0.05 | 3 TO 7 | ⊙ |
| EXAMPLE 6 | 5 | 5 | 0.05 | 3 TO 7 | ⊙ |
| COMPARATIVE EXAMPLE 1 | — | — | 0.05 | 2 TO 3 | — |
| COMPARATIVE EXAMPLE 2 | — | — | 0.05 | — | ⊙ |
| COMPARATIVE EXAMPLE 3 | — | — | 0.05 | — | ○ |

As apparent from Table 1, the liquid crystal panel according to the present invention exhibits excellent light resistance as compared with Comparative Example 1.

Further, in the liquid crystal panel according to the present invention, it is possible to obtain a sufficient pretilt angle and surely regulate the alignment state of the liquid crystal molecules. To the contrary, in the liquid crystal panels according to Comparative Examples 2 and 3, it is impossible to obtain a sufficient pretilt angle, and further it is difficult to regulate the alignment state of the liquid crystal molecules.

Evaluation of Liquid Crystal Projector (Electronic Apparatus)

Using the TFT liquid crystal panels manufactured in the respective Examples and Comparative Examples, the liquid crystal projector having a structure as shown in FIG. 11 is assembled, and is consecutively driven for 5000 hours.

Moreover, as regards the evaluation of the liquid crystal projector, the evaluation of resolution is performed by observing projected images just after driving and after 5000 hours driving and is divided into four states as follows.

⊙: Bright projected images are observed.

○: Almost bright projected images are observed.

Δ: Slight resolution-deteriorated projected images are observed.

x: Dull projected images are observed.

The results are shown in Table 2.

TABLE 2

| | RESOLUTION | |
| --- | --- | --- |
| | JUST AFTER DRIVING | AFTER 5000 HOURS DRIVING |
| EXAMPLE 1 | ⊙ | ⊙ |
| EXAMPLE 2 | ⊙ | ⊙ |
| EXAMPLE 3 | ⊙ | ⊙ |
| EXAMPLE 4 | ⊙ | ⊙ |
| EXAMPLE 5 | ⊙ | ⊙ |
| EXAMPLE 6 | ⊙ | ⊙ |
| COMPARATIVE EXAMPLE 1 | ⊙ | x |
| COMPARATIVE EXAMPLE 2 | x | x |
| COMPARATIVE EXAMPLE 3 | Δ | Δ |

As apparent from Table 2, in the liquid crystal projector (an electronic apparatus) manufactured using the liquid crystal panels according to Examples 1 to 6, it is possible to obtain bright projected images even when the liquid crystal projector is consecutively driven for a long time.

To the contrary, in the liquid crystal projector manufactured using the liquid crystal panel according to Comparative Example 1, resolution of the projected images is remarkably lowered according to the driving time. This may be because, though the alignment of the liquid crystal molecules is arranged in order at the earlier stage, the alignment film is deteriorated and the alignment properties of the liquid crystal molecules are lowered, due to driving for a long time. Moreover, in the liquid crystal projector manufactured using the liquid crystal panel according to Comparative Examples 2 and 3, bright projected images are not obtained from the beginning of the driving. This may be because the alignment property of the inorganic alignment film is originally low.

Further, the personal computer, the cellular phone and the digital still camera comprising the liquid crystal panel according to the present invention are manufactured, and the same evaluation is performed on these apparatuses, such that the same results are obtained.

From these results, it can be seen that the liquid crystal panel and the electronic apparatus have excellent light resistance and maintain stable properties even when they are used for a long time.

What is claimed is:

1. A method of forming an inorganic alignment film on a base substrate, comprising:
   a film-forming step of forming a film made substantially of an inorganic material on the base substrate; and
   a milling step of irradiating ion beams onto a surface of the film from a direction inclined at a predetermined angle $\theta_b$ with respect to a direction vertical to the surface of the film,
   wherein the milling step further includes forming concave portions in the surface of the film, the concave portions having inclined surfaces, and arranging an inclination direction of the inclined surfaces to provide the concave portions with a predetermined directivity.

2. The method of forming an inorganic alignment film according to claim 1,
   wherein the predetermined angle $\theta_b$ is at least about 20°.

3. The method of forming an inorganic alignment film according to claim 1,
   wherein in the milling step, an acceleration voltage of the ion beams during the irradiation of the ion beams is about 400 to about 1400 V.

4. The method of forming an inorganic alignment film according to claim 1,
   wherein in the milling step, a current of the ion beams to be irradiated is about 100 to about 1000 mA.

5. The method of forming an inorganic alignment film according to claim 1,
   wherein in the milling step, a pressure of an atmosphere in the vicinity of the film is $5.0 \times 10^{-3}$ Pa or less.

6. The method of forming an inorganic alignment film according to claim 1,
   wherein the film-forming step further comprises a sputtering method.

7. The method of forming an inorganic alignment film according to claim 1,
   wherein the inorganic material substantially comprises silicon oxide.

8. An inorganic alignment film formed by a method of forming an inorganic alignment film according to claim 1.

9. The inorganic alignment film according to claim 8, wherein an average thickness of the inorganic alignment film is about 0.02 to about 0.3 μm.

10. A substrate for an electronic device, comprising:
    electrodes on a substrate; and
    an inorganic alignment film according to claim 8 on the substrate.

11. A liquid crystal panel comprising:
    an inorganic alignment film according to claim 8 and
    a liquid crystal layer.

12. An electronic apparatus comprising a liquid crystal panel according to claim 11.

13. An electronic apparatus comprising light valves, each light valve having a liquid crystal panel according to claim 11,
    wherein an image is projected using at least one of the light valves.

14. An electronic apparatus comprising:
    three light valves corresponding to red, green and blue, which form an image;
    a light source;

a color separating optical system for separating light from the light source into red, green and blue light components and for guiding each light component to the corresponding light valve;

a color synthesizing optical system for synthesizing the image; and a projecting optical system for projecting the synthesized image, wherein each light valve comprises a liquid crystal panel according to claim 11.

15. A liquid crystal panel comprising:

a pair of inorganic alignment films according to claim 8; and a liquid crystal layer interposed between the pair of inorganic alignment films.

16. A method of forming an inorganic alignment film on a base substrate, comprising:

a film-forming step of forming a film made substantially of an inorganic material on the base substrate; and a milling step of irradiating ion beams onto a surface of the film from a direction inclined at a predetermined angle $\theta_b$ with respect to a direction vertical to the surface of the film, wherein in the milling step, a current of the ion beams to be irradiated is about 100 to about 1000 mA.

17. A method of forming an inorganic alignment film on a base substrate, comprising:

a film-forming step of forming a film made substantially of an inorganic material on the base substrate; and a milling step of irradiating ion beams onto a surface of the film from a direction inclined at a predetermined angle $\theta_b$ with respect to a direction vertical to the surface of the film, wherein an average thickness of the inorganic alignment film is about 0.02 to about 0.3 µm.

* * * * *